United States Patent
Nishimura et al.

(10) Patent No.: US 8,159,303 B2
(45) Date of Patent: Apr. 17, 2012

(54) OPERATIONAL AMPLIFIER

(75) Inventors: Kouichi Nishimura, Kanagawa (JP);
Yoshihiko Hori, Kanagawa (JP)

(73) Assignee: Renesas Electronics Corporation,
Kawasaki-shi, Kanagawa (JP)

( * ) Notice: Subject to any disclaimer, the term of this patent is extended or adjusted under 35 U.S.C. 154(b) by 179 days.

(21) Appl. No.: 12/654,960

(22) Filed: Jan. 11, 2010

(65) Prior Publication Data
US 2010/0109774 A1    May 6, 2010

Related U.S. Application Data

(63) Continuation-in-part of application No. 12/457,554, filed on Jun. 15, 2009, now abandoned.

(30) Foreign Application Priority Data

Jul. 14, 2008   (JP) .................................. 2008-182326

(51) Int. Cl.
    *H03F 3/217*    (2006.01)

(52) U.S. Cl. ......................................... 330/260; 330/98
(58) Field of Classification Search .................. 330/260, 330/98, 150, 310
See application file for complete search history.

(56) References Cited

U.S. PATENT DOCUMENTS

| | | | |
|---|---|---|---|
| 5,392,043 A * | 2/1995 | Ribner | 341/143 |
| 5,708,376 A * | 1/1998 | Ikeda | 327/50 |
| 7,106,240 B2 * | 9/2006 | Cringean | 341/163 |

FOREIGN PATENT DOCUMENTS

JP     6-326529    11/1994

* cited by examiner

*Primary Examiner* — Henry Choe
(74) *Attorney, Agent, or Firm* — McGinn IP Law Group, PLLC

(57) ABSTRACT

An operational amplifier includes an input stage amplifier that receives an input signal, an output stage amplifier that amplifies a signal output from the input stage amplifier and outputs the signal, a capacitor that is connected between an input node and an output node of the output stage amplifier, and a charge and discharge control circuit that controls a charge and discharge current of the capacitor.

19 Claims, 15 Drawing Sheets

RELATED ART

US 8,159,303 B2

OPERATIONAL AMPLIFIER

CROSS-REFERENCE TO RELATED APPLICATIONS

The present invention is a Continuation-in-Part (CIP) application of commonly-assigned, U.S. patent application Ser. No. 12/457,554 filed Jun. 15, 2009 now abandoned which is hereby incorporated by reference in their entirety.

BACKGROUND

1. Field of the Invention

The present invention relates to an operational amplifier and, particularly, to an operational amplifier that includes a capacitor between an input node and an output node of an output stage amplifier.

2. Description of Related Art

In semiconductor devices, operational amplifiers are widely used to amplify signals to be handled. An example of operational amplifiers is disclosed in Japanese Unexamined Application Patent Publication No. H6-326529 (U.S. Pat. No. 5,311,145). An operational amplifier includes an input stage amplifier and an output stage amplifier. The input stage amplifier converts an input signal according to the input structure of the output stage amplifier and amplifies the input signal. Further, the input stage amplifier sets idling currents flowing through transistors constituting the output stage amplifier. The output stage amplifier amplifies the signal generated in the input stage amplifier and outputs the signal.

In the operational amplifier, defects such as oscillation possibly occur if the phase margin of the operational amplifier is small. In order to increase the phase margin of the operational amplifier, a phase compensation capacitor may be placed between an input node and an output node of the output stage amplifier. FIG. 16 shows a block diagram of an operational amplifier 100 that includes a phase compensation capacitor.

Referring to FIG. 16, the operational amplifier 100 includes an input stage amplifier 110 and an output stage amplifier 111. The inverting input terminal of the input stage amplifier 110 is connected to an output terminal Vout, and the non-inverting input terminal of the input stage amplifier 110 is connected to an input terminal Vin+. The output of the input stage amplifier 110 is output as a single-end signal. The input stage amplifier 110 outputs a current I. The output stage amplifier 111 inverts the single-end signal that is output from the input stage amplifier 110 and outputs the inverted signal. Further, a capacitor C to serve as a phase compensation capacitor is connected between an input node and an output node of the output stage amplifier 111.

Thus, the operational amplifier 100 functions as a buffer in which the output terminal is connected to the inverting input terminal of the input stage amplifier 110. The slew rate SR of the operational amplifier 100 is represented by the following expression (1):

$$SR = \frac{dVo}{dt} = \frac{I}{C} \qquad (1)$$

In the above expression (1), Vo indicates the voltage of the output terminal, t indicates time, I indicates the output current of the input stage amplifier 110, and C indicates the capacitance of the capacitor. The expression (1) shows that the slew rate decreases when the capacitance of the capacitor increases and the slew rate increases when the current output from the input stage amplifier 110 increases.

SUMMARY

It is considered, based on the expression (1), that the slew rate increases if the capacitance of the capacitor decreases or the current output from the input stage amplifier 110 increases. However, if the capacitance of the capacitor decreases, the phase margin of the operational amplifier 100 decreases, which causes the possibility of oscillation to increase. Further, if the output current of the input stage amplifier 110 increases, the current consumption of the operational amplifier 100 increases. Therefore, the operational amplifier 100 has a problem that it is difficult to transmit a high-speed signal while maintaining a sufficient phase margin and lowering the current consumption of the amplifier.

An exemplary aspect of an embodiment of the present invention is an operational amplifier that includes an input stage amplifier that receives an input signal, an output stage amplifier that amplifies a signal output from the input stage amplifier and outputs the signal, a capacitor that is connected between an input node and an output node of the output stage amplifier, and a charge and discharge control circuit that controls a charge and discharge current of the capacitor.

In the operational amplifier according to the exemplary aspect of an embodiment of the present invention, the charge and discharge current of the capacitor connected between the input node and the output node of the output stage amplifier is controlled by the charge and discharge control circuit. Specifically, even when the output voltage of the operational amplifier makes transition, the charge and discharge current of the capacitor is controlled by the charge and discharge control circuit. Thus, in the operational amplifier according to the exemplary aspect of an embodiment of the present invention, it is possible to ignore the capacitance of the capacitor with respect to the slew rate. Accordingly, in the operational amplifier according to the exemplary aspect of an embodiment of the present invention, it is possible to increase the slew rate as well as increasing the phase margin by increasing the capacitance of the capacitor. Further, there is no need to increase the output current of the input stage amplifier in order to improve the slew rate.

According to the exemplary aspect of an embodiment of the present invention, it is possible to provide an operational amplifier capable of improving the slew rate while maintaining a sufficient phase margin and lowering the current consumption.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

[First Exemplary Embodiment]

Figure 1:
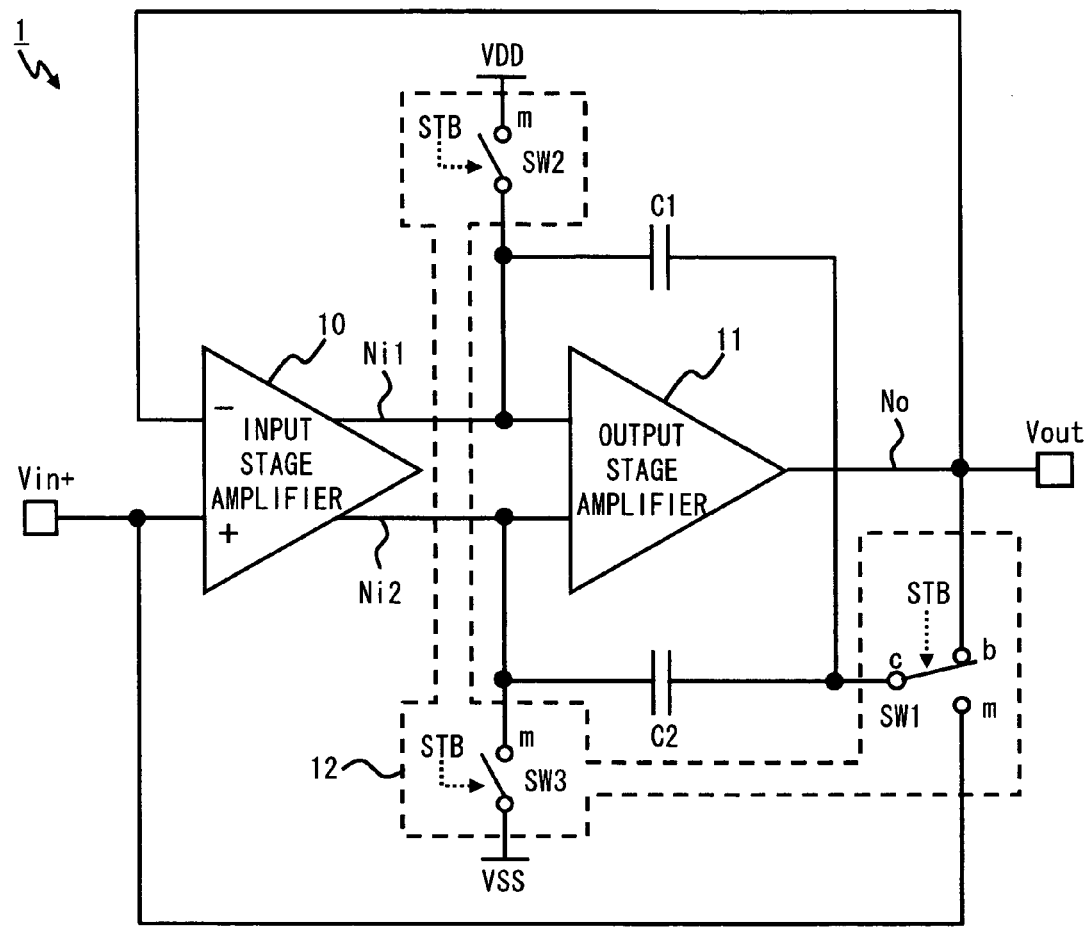
FIG. 1 is a block diagram showing an operational amplifier according to a first exemplary embodiment of the present invention.

Exemplary embodiments of the present invention are described hereinafter with reference to the drawings. FIG. 1 shows a block diagram of an operational amplifier 1 according to a first exemplary embodiment of the present invention. Referring to FIG. 1, the operational amplifier 1 includes an input stage amplifier 10, an output stage amplifier 11, a charge and discharge control circuit 12, a first capacitor (e.g. a capacitor C1), and a second capacitor (e.g. a capacitor C2). The input stage amplifier 10 has a non-inverting input terminal and an inverting input terminal. The input stage amplifier 10 and the output stage amplifier 11 are connected in series, and the output node of the output stage amplifier 11 is connected to the inverting input terminal of the input stage amplifier 10. The operational amplifier 1 thereby operates as a buffer.

The input stage amplifier 10 outputs a first signal and a second signal that are in-phase with each other based on a signal input to the non-inverting input terminal. The output stage amplifier 11 receives the first signal through a first input node Ni1 and receives the second signal through a second input node Ni2. The output stage amplifier 11 then outputs an inverted signal of the input signal to an output node No. The output node No is connected to an output terminal Vout, and the output terminal Vout is connected to a load to be driven by the operational amplifier 1. The load is a liquid crystal display device, for example, and the operational amplifier 1 operates as a source driver of the liquid crystal display device.

The capacitors C1 and C2 are phase compensation capacitors, for example. The capacitor C1 is connected between the first input node Ni1 and the output node No. The capacitor C2 is connected between the second input node Ni2 and the output node No. In this exemplary embodiment, the terminals of the capacitors C1 and C2 on the output node No side are connected to the output node No through the charge and discharge control circuit 12.

The charge and discharge control circuit 12 includes a first switch (e.g. a switch SW1) and a second switch (e.g. a switch SW2 and a switch SW3). The continuity of the switch SW1, the switch SW2 and the switch SW3 are respectively controlled by a control signal. In this exemplary embodiment, a transfer type switch is used as the switch SW1. The switch SW1 has a common terminal c, a make terminal m and a break terminal b, and the common terminal c and the break terminal b have continuity when the control signal is low level, and the common terminal c and the make terminal m have continuity when the control signal is high level. On the other hand, a make type switch is used as the switch SW2. The make type switch has two terminals, and it is opened when the control signal is low level, and it is closed when the control signal is high level. Likewise, a make type switch is used as the switch SW3. The operation of the make type switch that is used as the switch SW3 is the same as the operation of the switch SW2. Further, in this exemplary embodiment, a strobe signal STB that is used in a liquid crystal display device is used as the control signal.

In the switch SW1, the common terminal c is connected to the terminals of the capacitors C1 and C2 on the output node No side, the break terminal b is connected to the output node No, and the make terminal m is connected to a first power supply (e.g. the output of the circuit in the previous stage which is connected to the input terminal Vin+). In the switch SW2, one terminal is connected to the terminal of the capacitor C1 on the input node Ni1 side, and the other terminal is connected to a second power supply (e.g. a positive power supply VDD). In the switch SW3, one terminal is connected to the terminal of the capacitor C2 on the input node Ni2 side, and the other terminal is connected to a second power supply (e.g. a negative power supply VSS). The second power supply is a power supply that is connected to the terminal of the capacitor C1 or C2 on the input node side and supplies a power to the capacitor C1 or C2 according to the connection of the capacitor C1 or C2.

Figure 2:
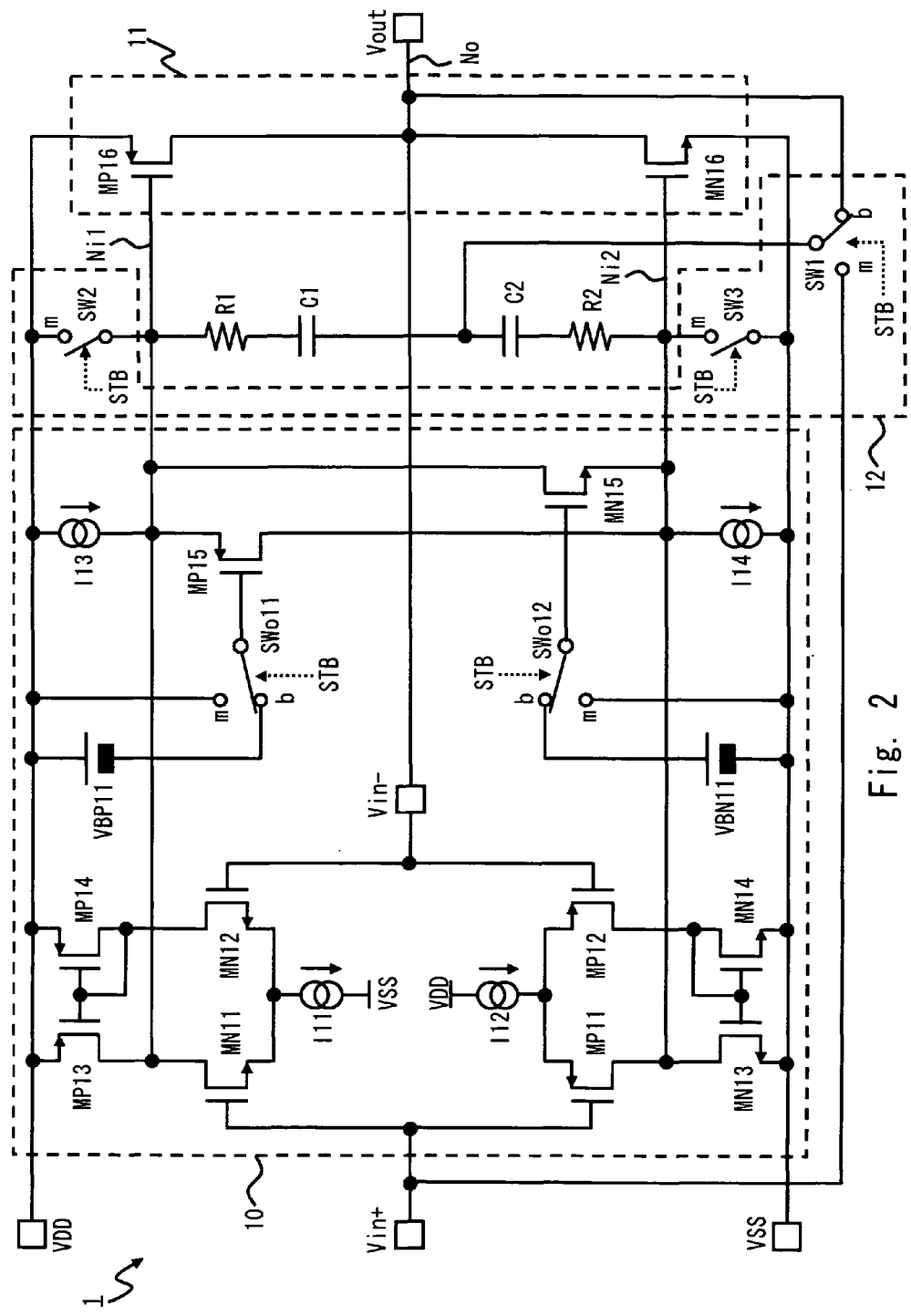
FIG. 2 is a circuit diagram showing a specific circuit of the operational amplifier according to the first exemplary embodiment.

FIG. 2 shows an example of a specific circuit of the input stage amplifier 10 and the output stage amplifier 11. The input stage amplifier 10 and the output stage amplifier 11 are described hereinafter with reference to FIG. 2.

The input stage amplifier 10 includes a first differential pair made up of an NMOS transistor MN11 and an NMOS transistor MN12 and a second differential pair made up of a PMOS transistor MP11 and a PMOS transistor MP12. The inputs of the two differential pairs are connected in common, and the gate of the NMOS transistor MN11 and the gate of the PMOS transistor MP11 serve as the non-inverting input terminal of the input stage amplifier 10, and the gate of the NMOS transistor MN12 and the gate of the PMOS transistor MP12 serve as the inverting input terminal of the input stage amplifier 10.

The sources of the NMOS transistors MN and MN12 that form the first differential pair are connected in common, and a first current source I11 is connected between a common connection point and the negative power supply VSS. Further, the input stage amplifier 10 includes PMOS transistors MP13 and MP14 that are connected in a current mirror configuration as the active load of the first differential pair. The first input node Ni1 is connected to a connection point between the drain of the NMOS transistor MN and the drain of the PMOS transistor MP13.

The sources of the PMOS transistors MP11 and MP12 that form the second differential pair are connected in common, and a second current source 112 is connected between a common connection point and the positive power supply VDD. Further, the input stage amplifier 10 includes NMOS transistors MN13 and MN14 that are connected in a current mirror configuration as the active load of the second differential pair. The second input node Ni2 is connected to a connection point between the drain of the PMOS transistor MP and the drain of the NMOS transistor MN 13.

A PMOS transistor MP15 and an NMOS transistor MN15 which operate as a floating current source are connected between the first input node Ni 1 and the second input node Ni2. Further, a third current source 113 is connected between the first input node Ni1 and the positive power supply VDD, and a fourth current source I14 is connected between the second input node Ni2 and the negative power supply VSS.

The source of the PMOS transistor MP 15 is connected to the first input node Ni1, and the drain of the PMOS transistor MP15 is connected to the second input node Ni2. Further, the gate of the PMOS transistor MP15 is connected to the common terminal c of a transfer type switch SWo11. The make terminal m of the transfer type switch SWo11 is connected to the positive power supply VDD, and the break terminal b is connected to the negative electrode of a first bias setting voltage source VBP11. The positive electrode of the first bias setting voltage source VBP11 is connected to the positive power supply VDD. The source of the NMOS transistor MN15 is connected to the second input node Ni2, and the drain of the NMOS transistor MN15 is connected to the first input node Ni1. Further, the gate of the NMOS transistor MN 15 is connected to the common terminal c of a transfer type switch SWo12. The make terminal m of the transfer type switch SWo12 is connected to the negative power supply VSS, and the break terminal b is connected to the positive electrode of a second bias setting voltage source VBN11. The negative electrode of the second bias setting voltage source VBN11 is connected to the negative power supply VSS.

During normal operation, the voltage values of the gates of the PMOS transistor MP15 and the NMOS transistor MN15 are set by the first bias setting voltage source VBP11 and the second bias setting voltage source VBN11, respectively, and operate as a floating current source based on the voltage values set to their gates. The operational amplifier 1 determines currents (so-called idling currents) to flow through output transistors (which are a PMOS transistor MP16 and an NMOS transistor MN16 in operation in this exemplary embodiment) at no load based on the currents flowing through the floating current source. The both ends of the current sources are floating and thus can be connected to arbitrary positions. The connection of the PMOS transistor MP15 and the NMOS transistor MN15 is current feedback connection, and the feedback amount is total feedback. The common connection point between the source of the PMOS transistor MP15 and the drain of the NMOS transistor MN15 and the common connection point between the drain of the PMOS transistor MP15 and the source of the NMOS transistor MN15 have high impedance.

The floating current source and the idling current of the PMOS transistor MP16 and the NMOS transistor MN16 are described hereinafter. First, the voltage generated by the first bias setting voltage source VBP11 is set to be equal to the sum of the voltage between the gate and the source of the PMOS transistor MP16 and the voltage between the gate and the source of the PMOS transistor MP15. If the voltage value of the first bias setting voltage source VBP11 is VBP11, the voltage between the gate and the source of the PMOS transistor MP15 is VGS (MP15) and the voltage between the gate and the source of the PMOS transistor MP16 is VGS (MP16), VBP11 can be represented by the following expression (2):

$$VBP11 = VGS(MP15) + VGS(MP16) \quad (2)$$

Further, the voltage VGS between the gate and the source of the PMOS transistor MP15 or the PMOS transistor MP16 is represented by the following expression (3). In the expression (3), $\beta = (W/L) \times \mu Co$, W is a transistor gate width, L is a transistor gate length, μ is carrier mobility, Co is gate oxide film capacitance per unit area, VT is a transistor threshold voltage, and Id is a drain current.

$$VGS = \sqrt{\frac{2Id}{\beta}} + VT \quad (3)$$

When forming the floating current source, the drain currents of the PMOS transistor MP15 and the NMOS transistor MN15 are set to be equal. Specifically, if a current flowing out of the third current source 113 is represented by I13, a current I13/2 flows through the PMOS transistor MP15 and the NMOS transistor MN15. On the other hand, if the idling current is represented by Iidle and the drain current of the PMOS transistor MP16 is represented by Iidle (MP16), the current flowing through the PMOS transistor MP16 is represented by the following expression (4). In the expression (4), β(MP15) is β of the PMOS transistor MP15, β(MP16) is β of the PMOS transistor MP16, and β is represented by $\beta = (W/L) \times \mu Co$.

$$VBP11 = \sqrt{\frac{I3}{\beta(MP16)}} + \sqrt{\frac{2 \cdot Iidle(MP16)}{\beta(MP16)}} + 2 \cdot VT \quad (4)$$

If the expression (4) is solved with respect to Iidle (MP16), the idling current Iidle (MP16) can be obtained.

Further, a current flowing into the fourth current source I14 needs to be equal to a current flowing out of the third current source I13. If the current flowing into the fourth current source I14 and the current value of the third current source I13 are different, a difference between the currents generated by the two current sources flows into the active load, resulting in an increase in the offset voltage of the operational amplifier 1. The setting of the voltage value of the second bias setting voltage source VBN11 can be performed in the same manner as that of the first bias setting voltage source VBP11.

Further, the first bias setting voltage source VBP11 and the second bias setting voltage source VBN11 are preferably made up of two MOS transistors and a constant current source. In such a configuration, VBP11 of the above expression (4) has the term 2VT which is the same as the right-hand side and therefore fluctuations related to the term are cancelled out. It is thereby possible to suppress fluctuations of the voltage values generated in the first bias setting voltage source VBP11 and the second bias setting voltage source VBN11 due to device variation.

In the output stage amplifier 11, the PMOS transistor MP16 and the NMOS transistor MN16 are connected in series between the positive power supply VDD and the negative power supply VSS. The gate of the PMOS transistor MP16 is connected to the first input node Ni1, and the gate of the NMOS transistor MN16 is connected to the second input node Ni2. A connection point between the drain of the PMOS transistor MP16 and the drain of the NMOS transistor MN16 serve as the output node No.

In the circuit diagram shown in FIG. 2, the capacitors C1 and C2 are configured such that a capacitor and a resistor are connected in series in order to perform zero point compensation that cancels the phase-delay zero point of the operational amplifier in addition to phase compensation of the operational amplifier. The connections of the capacitors C1 and C2 and the switches SW1 to SW3 are the same as those shown in FIG. 1 and thus not repeatedly described.

Figure 3D:
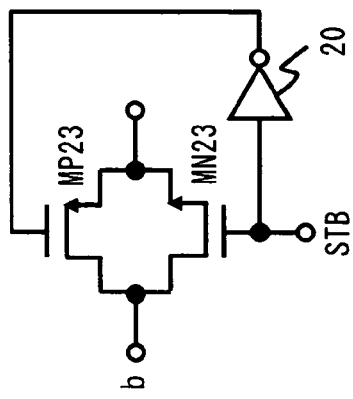
FIGS. 3A to 3D are circuit diagrams showing examples of make type switches and break type switches used in the operational amplifier according to the first exemplary embodiment.
Figure 3C:
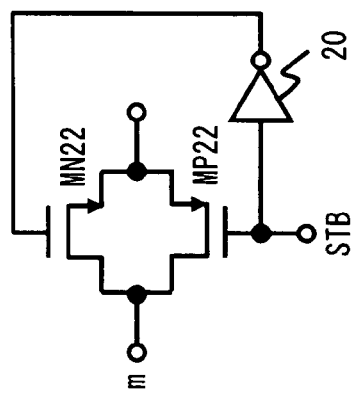
Figure 3B:
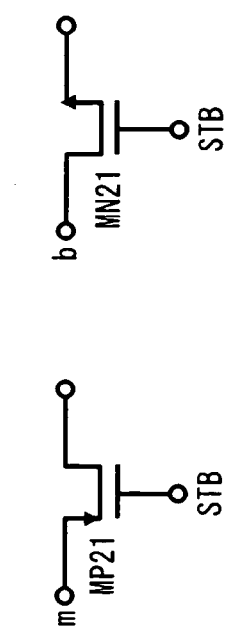
Figure 3A:
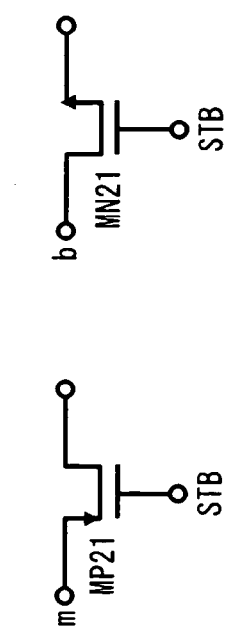
Figure 4C:
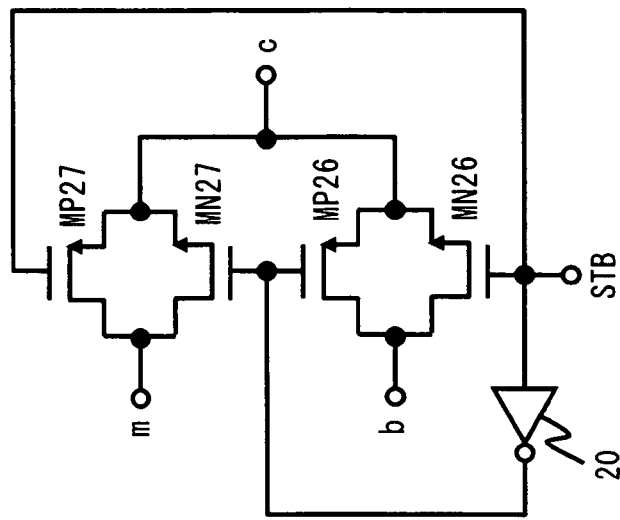
FIGS. 4A to 4C are circuit diagrams showing examples of transfer type switches used in the operational amplifier according to the first exemplary embodiment.
Figure 4B:
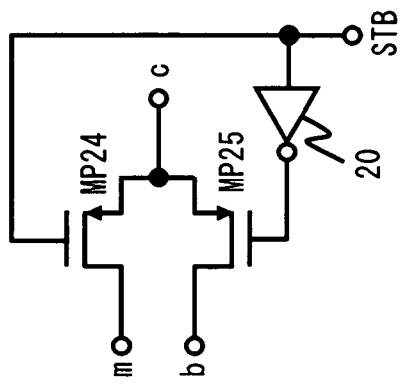
Figure 4A:
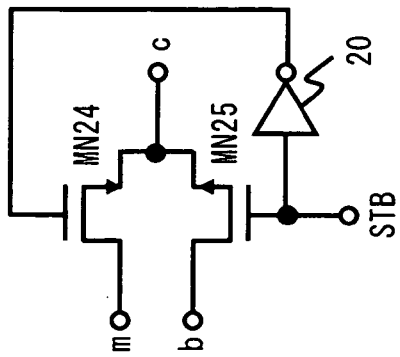

FIGS. 3A to 3D and 4A to 4C show examples of circuits for implementing the switches used in this exemplary embodiment. FIGS. 3A and 3C show examples of make type switches, and FIGS. 3B and 3D show examples of break type switches. FIGS. 4A to 4C show examples of transfer type switches. The make type switch shown in FIG. 3A is made up of an PMOS transistor MP21. The gate of the PMOS transistor MP21 functions as a control terminal, the source functions as a first terminal and the drain functions as a second terminal. The source and the drain have continuity when the control signal (which is the strobe signal STB in this exemplary embodiment) input to the gate is high level, and the source and the drain have no continuity when the strobe signal STB is low level.

The break type switch shown in FIG. 3B is made up of a NMOS transistor MN21. The gate of the NMOS transistor MN21 functions as a control terminal, the source functions as a first terminal and the drain functions as a second terminal. The source and the drain have no continuity when the strobe signal STB input to the gate is high level, and the source and the drain have continuity when the strobe signal STB is low level.

The make type switch shown in FIG. 3C is made up of an NMOS transistor MN22 and a PMOS transistor MP22. In the make type switch, the source of the NMOS transistor MN22 and the source of the PMOS transistor MP22 are connected together, and the drain of the NMOS transistor MN22 and the drain of the PMOS transistor MP22 are connected together. The sources connected in common function as a first terminal, and the drains connected in common function as a second terminal. Further, the strobe signal STB is input to the gate of the PMOS transistor MP22, and the strobe signal STB is input to the gate of the NMOS transistor MN22 through an inverter 20. The source and the drain have continuity when the strobe signal STB input to the gate is high level, and the source and the drain have no continuity when the strobe signal STB is low level.

The break type switch shown in FIG. 3D is made up of an NMOS transistor MN23 and a PMOS transistor MP23. In the break type switch, the source of the NMOS transistor MN23 and the source of the PMOS transistor MP23 are connected together, and the drain of the NMOS transistor MN23 and the drain of the PMOS transistor MP23 are connected together. The sources connected in common function as a first terminal, and the drains connected in common function as a second terminal. Further, the strobe signal STB is input to the gate of the NMOS transistor MN23, and the strobe signal STB is input to the gate of the PMOS transistor MP23 through an inverter 20. The source and the drain have no continuity when the strobe signal STB input to the gate is high level, and the source and the drain have continuity when the strobe signal STB is low level.

The transfer type switch shown in FIG. 4A is made up of NMOS transistors MN24 and MN25. In the transfer type switch, the source of the NMOS transistor MN24 and the source of the NMOS transistor MN25 are connected together, and a common connection point functions as a common terminal c. The drain of the NMOS transistor MN24 functions as a make terminal m, and the drain of the NMOS transistor MN25 functions as a break terminal b. Further, the strobe signal STB is input to the gate of the NMOS transistor MN25, and the strobe signal STB is input to the gate of the NMOS transistor MN24 through an inverter 20. Thus, control signals having opposite phases are respectively input to the gates of the NMOS transistors MN24 and MN25. In this configuration, the make terminal m and the common terminal c have continuity when the input strobe signal STB is high level, and the break terminal b and the common terminal c have continuity when the strobe signal STB is low level.

The transfer type switch shown in FIG. 4B is made up of PMOS transistors MP24 and MP25. In the transfer type switch, the source of the PMOS transistor MP24 and the source of the PMOS transistor MP25 are connected together, and a common connection point functions as a common terminal c. The drain of the PMOS transistor MP24 functions as a make terminal m, and the drain of the PMOS transistor MP25 functions as a break terminal b. Further, the strobe signal STB is input to the gate of the PMOS transistor MP24, and the strobe signal STB is input to the gate of the PMOS transistor MP25 through an inverter 20. Thus, control signals having opposite phases are respectively input to the gates of the PMOS transistors MP24 and MP25. In this configuration, the make terminal m and the common terminal c have continuity when the input strobe signal STB is high level, and the break terminal b and the common terminal c have continuity when the strobe signal STB is low level.

The transfer type switch shown in FIG. 4C is made up of NMOS transistors MN26 and MN27 and PMOS transistors MP26 and MP27. In the transfer type switch, the source of the PMOS transistor MP26 and the source of the NMOS transistor MN26 are connected together, and a common connection point is connected to a common terminal c. Further, the source of the PMOS transistor MP27 and the source of the NMOS transistor MN27 are connected together, and a common connection point is connected to the common terminal c. The drain of the NMOS transistor MN27 and the drain of the PMOS transistor MP27 are connected together and function as a make terminal m. The drain of the NMOS transistor MN26 and the drain of the PMOS transistor MP26 are connected together and function as a break terminal b. Further, the strobe signal STB is input to the gate of the NMOS transistor MN26 and the gate of the PMOS transistor MP27, and the strobe signal STB is input to the gate of the NMOS transistor MN27 and the gate of the PMOS transistor MP26 through an inverter 20. In this configuration, the make terminal m and the common terminal c have continuity when the input strobe signal STB is high level, and the break terminal b and the common terminal c have continuity when the strobe signal STB is low level.

FIGS. 3A to 3D and 4A to 4C show switches having different configurations, and it is preferred to use an appropriate switch according to the voltage variation range of the node to which the switch is connected in order to reduce the resistance occurring in the switch. For example, if the voltage of the node varies over a wide range from the negative power supply VSS to the positive power supply VDD, it is preferred to use the switches shown in FIGS. 3C, 3D and 4C. On the other hand, if the voltage of the node varies at the voltage close to the positive power supply VDD (e.g. in the voltage range closer to the positive power supply VDD compared to the voltage that is half of a voltage difference between the negative power supply VSS and the positive power supply VDD), it is preferred to use the switches shown in FIGS. 3B and 4B. Further, if the voltage of the node varies at the voltage close to the negative power supply VSS (e.g. in the voltage range closer to the negative power supply VSS compared to the voltage that is half of a voltage difference between the negative power supply VSS and the positive power supply VDD), it is preferred to use the switches shown in FIGS. 3A and 4A. In this exemplary embodiment, the switch shown in FIG. 4C is used as the switch SW1, the switch shown in FIG. 3B is used as the switch SW2, and the switch shown in FIG. 3A is used as the switch SW3.

The operation of the operational amplifier 1 according to the exemplary embodiment is described hereinafter. In the followings, the case where a source line of a liquid crystal display panel is connected as a load connected to the output terminal Vout of the operational amplifier 1 is described as an example of the operation. In this case, the period during which the strobe signal STB is high level is called a charge recovery period. During the charge recovery period, the impedance of the output node No of the output stage amplifier 11 is set high. The output of the operational amplifier 1 and the liquid crystal display panel can be thereby regarded as being practically separated during the charge recovery period. Further, during the charge recovery period, the liquid crystal display panel neutralizes charges accumulated in a capacitor connected to the source line. Consequently, after the end of the charge recovery period, the potential of the source line is an intermediate potential between the positive power supply VDD and the negative power supply VSS.

Figure 5:
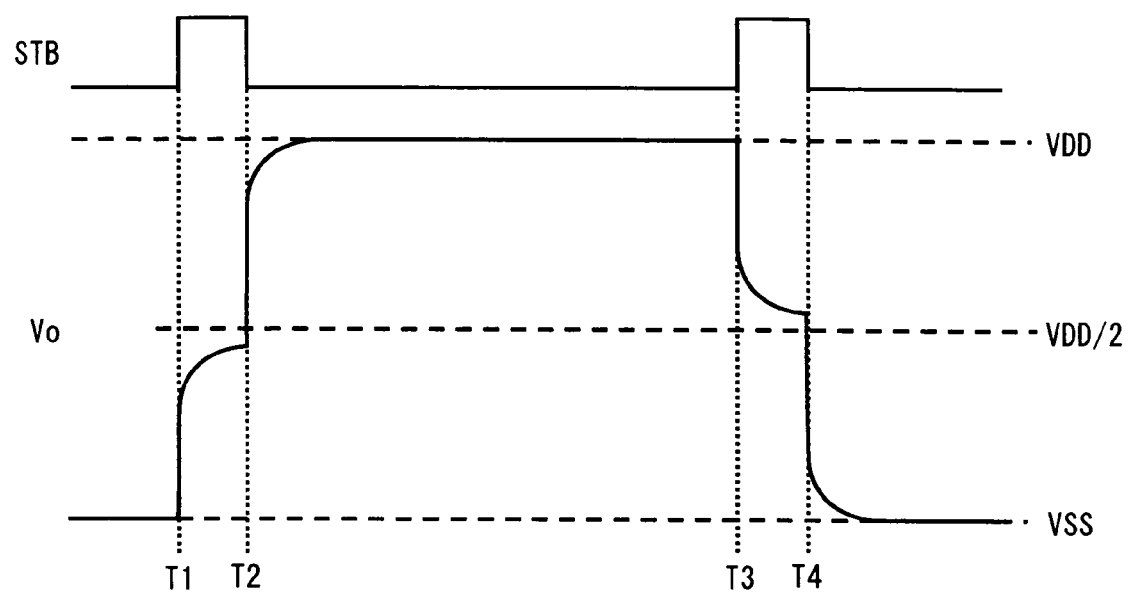
FIG. 5 is a timing chart showing the operation of the operational amplifier according to the first exemplary embodiment.

FIG. 5 is a timing chart showing the operation of the operational amplifier 1. In the liquid crystal display device, an operation called dot inversion that inverts the voltage to drive the source line in every given period is performed. The timing chart shown in FIG. 5 is when the operational amplifier 1 performs the dot inversion operation once. In the period before the timing T1, the strobe signal STB is low level, and the output voltage. Vo is low level (e.g. the voltage of the negative power supply VSS). At this time, the switch SW1 is connected to the break terminal b and the switch SW2 and the switch SW3 are opened. The capacitors C1 and C2 are thereby connected between the input node and the output node of the output stage amplifier 11. Further, the transfer type switches SWo11 and SWo12 of the input stage amplifier 10 are also connected to the break terminal b. The operational amplifier 1 thereby performs normal operation.

Then, the strobe signal STB rises at the timing T1 and it stays high level during the period from the timing T1 to the timing T2 (which is the above-described charge recovery period). Further, the signal input to the input terminal Vin+ changes from low level to high level (e.g. the voltage of the positive power supply VDD) at the timing T1. In the charge recovery period, the switch SW1 is connected to the make terminal m and the switch SW2 and the switch SW3 are closed. The voltages at the both ends of the capacitor C1 thereby become the positive power supply VDD, and the charges accumulated in the capacitor C1 are discharged. On the other hand, the positive power supply VDD and the negative power supply VSS are applied to the both ends of the capacitor C2. Therefore, the charge according to a voltage difference between the both ends is charged to the capacitor C2. The charge and discharge of the capacitors C1 and C2 are performed by the first power supply (which is the circuit in the previous stage that is connected to the input terminal Vin+ in this exemplary embodiment) and the second power supply (which is the positive power supply VDD and the negative power supply VSS in this exemplary embodiment). Further, the transfer type switches SWo11 and SWo12 of the input stage amplifier 10 are connected to the make terminal m. This prevents abnormal currents from flowing through the PMOS transistor MP15 and the NMOS transistor MN15 that operate as a floating current source. Further, because the switch SW2 and the switch SW3 are closed, the PMOS transistor MP16 and the NMOS transistor MN16 that serve as output transistors are both in the off state. The output node No of the output stage amplifier 11 thereby becomes high impedance, and the operational amplifier 1 is practically separated from the liquid crystal display panel. The voltage Vo of the output terminal in the charge recovery period rises sharply because the charge and distance of the capacitors C1 and C2 are performed rapidly by the first power supply and the second power supply.

Next, the strobe signal STB falls at the timing T2, and the switch SW1 is connected to the break terminal b and the switch SW2 and the switch SW3 are opened. The capacitors C1 and C2 are thereby connected between the input node and the output node of the output stage amplifier 11. Further, the transfer type switches SWo11 and SWo12 of the input stage amplifier 10 are also connected to the break terminal b. The operational amplifier 1 thereby performs normal operation.

After that, the strobe signal STB rises at the timing T3 and it stays high level during the period from the timing T3 to the timing T4 (which is the above-described charge recovery period). Further, the signal input to the input terminal Vin+ changes from high level to low level (e.g. the voltage of the negative power supply VSS) at the timing T3. In the charge recovery period, the switch SW1 is connected to the make terminal m and the switch SW2 and the switch SW3 are closed. The positive power supply VDD and the negative power supply VSS are thereby applied to the both ends of the capacitor C1. Therefore, the charge according to a voltage difference between the both ends is charged to the capacitor C1. On the other hand, the voltages at the both ends of the capacitor C2 become the negative power supply VSS, and the charges accumulated in the capacitor C2 are discharged. The charge and discharge of the capacitors C1 and C2 are performed by the first power supply and the second power supply. Further, the transfer type switches SWo11 and SWo12 of the input stage amplifier 10 are connected to the make terminal m. This prevents abnormal currents from flowing through the PMOS transistor MP15 and the NMOS transistor MN15 that operate as a floating current source. Further, because the switch SW2 and the switch SW3 are closed, the PMOS transistor MP16 and the NMOS transistor MN16 that serve as output transistors are both in the off state. The output node No of the output stage amplifier 11 thereby becomes high impedance, and the operational amplifier 1 is practically separated from the liquid crystal display panel. The voltage Vo of the output terminal in the charge recovery period falls sharply because the charge and distance of the capacitors C1 and C2 are performed rapidly by the first power supply and the second power supply.

Then, the strobe signal STB falls at the timing T4, and the switch SW1 is connected to the break terminal b and the switch SW2 and the switch SW3 are opened. The capacitors C1 and C2 are thereby connected between the input node and the output node of the output stage amplifier 11. Further, the transfer type switches SWo11 and SWo12 of the input stage amplifier 10 are also connected to the break terminal b. The operational amplifier 1 thereby performs normal operation.

As described above, in the operational amplifier 1 according to the exemplary embodiment, the capacitors C1 and C2 are separated from the output node and connected to the first power supply in the transition period of the output voltage. Then, the capacitors C1 and C2 are charged and discharged based on the currents output from the first power supply and the second power supply, thereby enabling the charge and discharge of the capacitors C1 and C2 to be performed more rapidly compared to the case where the charge and discharge control circuit 12 is not used. In the case where the charge and discharge control circuit 12 is not used, the charge and discharge of the capacitors C1 and C2 in the transition period of the output voltage are performed by the output current of the input stage amplifier 10. Therefore, the charge time to the capacitors C1 and C2 is longer compared to the case where the charge and discharge control circuit 12 is used. Specifically, in the operational amplifier 1 according to the exemplary embodiment, the charge and discharge control circuit 12 switches the charge current supply source to supply charge and discharge currents to the capacitors C1 and C2 to the first power supply having a higher current output capacity than the current output capacity of the input stage amplifier 10 at the timing when the voltage values applied to the both ends of the capacitors C1 and C2 change, thereby enabling reduction of the charge and discharge time to the capacitors C1 and C2 regardless of the capacitance values of the capacitors C1 and C2 and the current output capacity of the input stage amplifier 10. The operational amplifier 1 according to the exemplary embodiment thereby allows prevention of a decrease in slew rate due to the capacitance of the capacitors C1 and C2 and the current output capacity of the input stage amplifier 10. Further, the operational amplifier 1 according to the exemplary embodiment allows arbitrary selection of the capacitance of the capacitors C1 and C2 according to the phase margin of the operational amplifier 1 without consideration of the effect of the capacitance values on the slew rate.

Furthermore, the operational amplifier 1 according to the exemplary embodiment eliminates the need to increase the charge and discharge currents to the capacitors C1 and C2 in order to improve the slew rate. It is thereby possible to improve the slew rate while reducing the current consumption of the input stage amplifier 10 in the operational amplifier 1.

Further, in the operational amplifier 1, during the charge recovery period, the switch SW2 and the switch SW3 of the charge and discharge control circuit 12 change the voltage to be supplied to the terminals of the capacitors C1 and C2 on the input node side, and the output transistors (the PMOS transistor MP16 and the NMOS transistor MN16) of the output stage amplifier 11 are set to the off state. The output node No of the output stage amplifier 11 thereby becomes high impedance, and the operational amplifier 1 and the load (e.g. the liquid crystal display panel) to be driven by the operational amplifier 1 are practically separated. Therefore, even in the case where it is necessary to separate the operational amplifier 1 and the liquid crystal display panel during the charge recovery period as in the liquid crystal display device, there is no need to place a load separating switch between the output node No of the output stage amplifier 11 and the output terminal Vout. The load separating switch has slight resistance in the conducting state, and the resistance causes an increase in the output impedance of the operational amplifier 1, which results in a decrease in the current output capacity of the operational amplifier 1. Because the operational amplifier 1 according to the exemplary embodiment eliminates the need to use the load separating switch, it is possible to improve the current output capacity of the operational amplifier 1.

Figure 6:
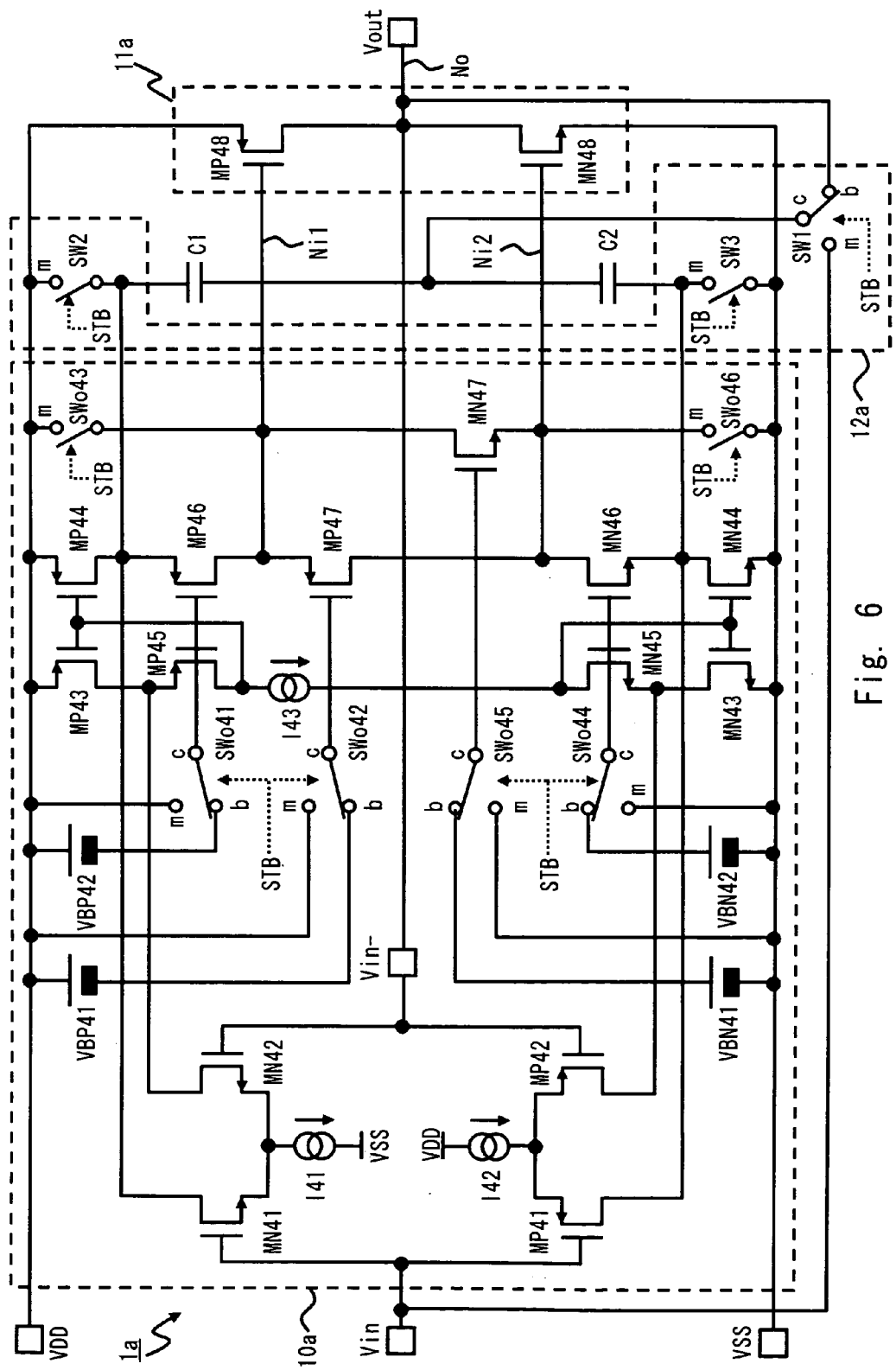
FIG. 6 is a circuit diagram showing another example of a specific circuit of the operational amplifier according to the first exemplary embodiment.

Although FIG. 2 shows the circuit diagram of the operational amplifier 1 according to the exemplary embodiment, the circuit of the operational amplifier 1 is not limited to the above-described exemplary embodiment but may be altered as appropriate. FIG. 6 is a circuit diagram showing another example of the operational amplifier (which is referred to as an operational amplifier 1a). Referring to FIG. 6, the operational amplifier 1a includes an input stage amplifier 10a having a different circuit configuration from the input stage amplifier 10. The operational amplifier 1a includes the output stage amplifier 11 and the charge and discharge control circuit 12 that are the same as those of the operational amplifier 1. In the input stage amplifier 10a, a PMOS transistor MP47, an NMOS transistor NM47 and a current source 143 form a floating current source.

Figure 7:
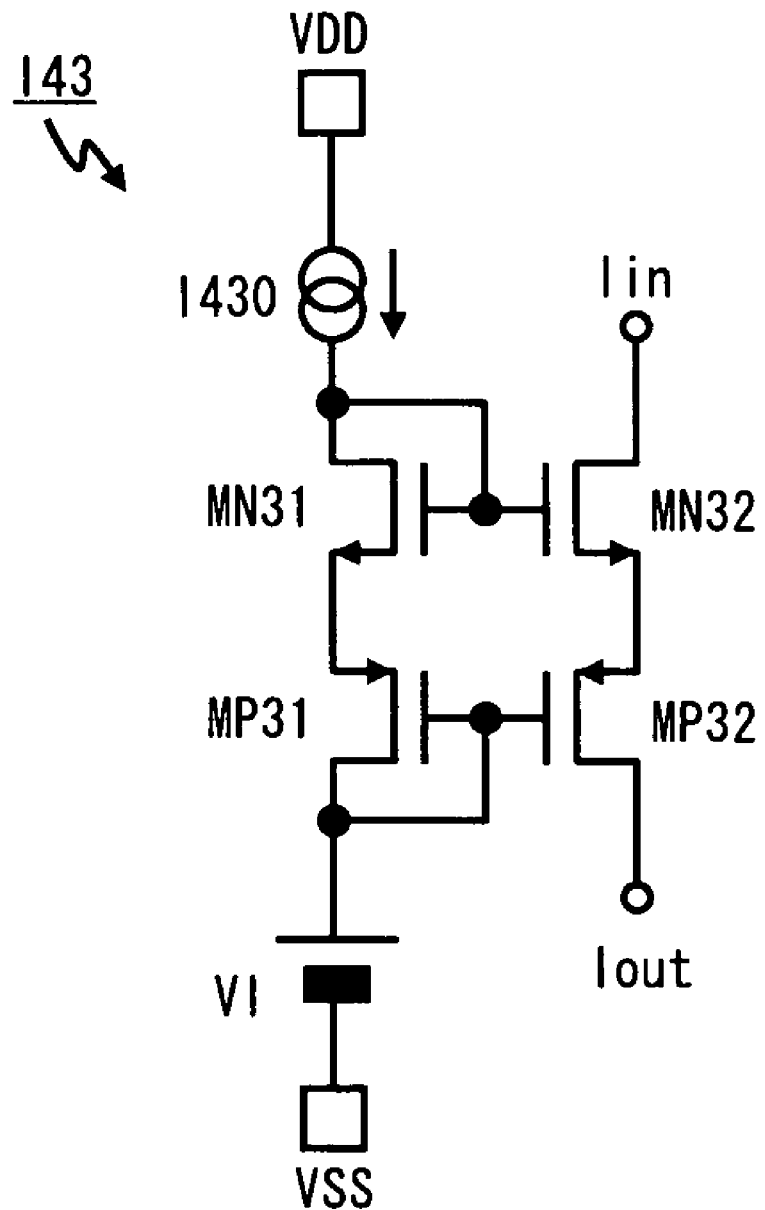
FIG. 7 is a circuit diagram showing a floating current source used in the operational amplifier shown in FIG. 6.

FIG. 7 shows an example of the circuit of the current source 143. Referring to FIG. 7, in the current source 143, a current source 1430, an NMOS transistor MN31, a PMOS transistor MP31 and a voltage source VI are connected in series between the positive power supply VDD and the negative power supply VSS. The current source 1430 sets the amount of currents flowing through the current source 143. The current source 143 further includes an NMOS transistor MN32 that forms a current mirror together with the NMOS transistor MN31 and a PMOS transistor MP32 that forms a current mirror together with the PMOS transistor MP31. The drain of the NMOS transistor MN32 functions as a current input terminal of the current source 143, and the drain of the PMOS transistor MP32 functions as a current output terminal of the current source 143. The source of the NMOS transistor MN32 is connected to the source of the PMOS transistor MP32. In this circuit configuration, the current source 143 can be connected between nodes different from the positive power supply VDD and the negative power supply VSS.

Because the switch SW2 and the switch SW3 are not directly connected to the gates of the output transistors in the operational amplifier 1a, the operational amplifier 1a includes switches SWo43 and SWo46 for turning the output transistors in the off state during the charge recovery period. Specifically, the operational amplifier 1a is configured by replacing the input stage amplifier 10 with the input stage amplifier 10a and altering the circuit as appropriate so as to avoid operational defects. Therefore, it is also possible in the operational amplifier 1a to improve the slew rate and set the capacitance values of the capacitors according to the phase margin.

[Second Exemplary Embodiment]

Figure 8:
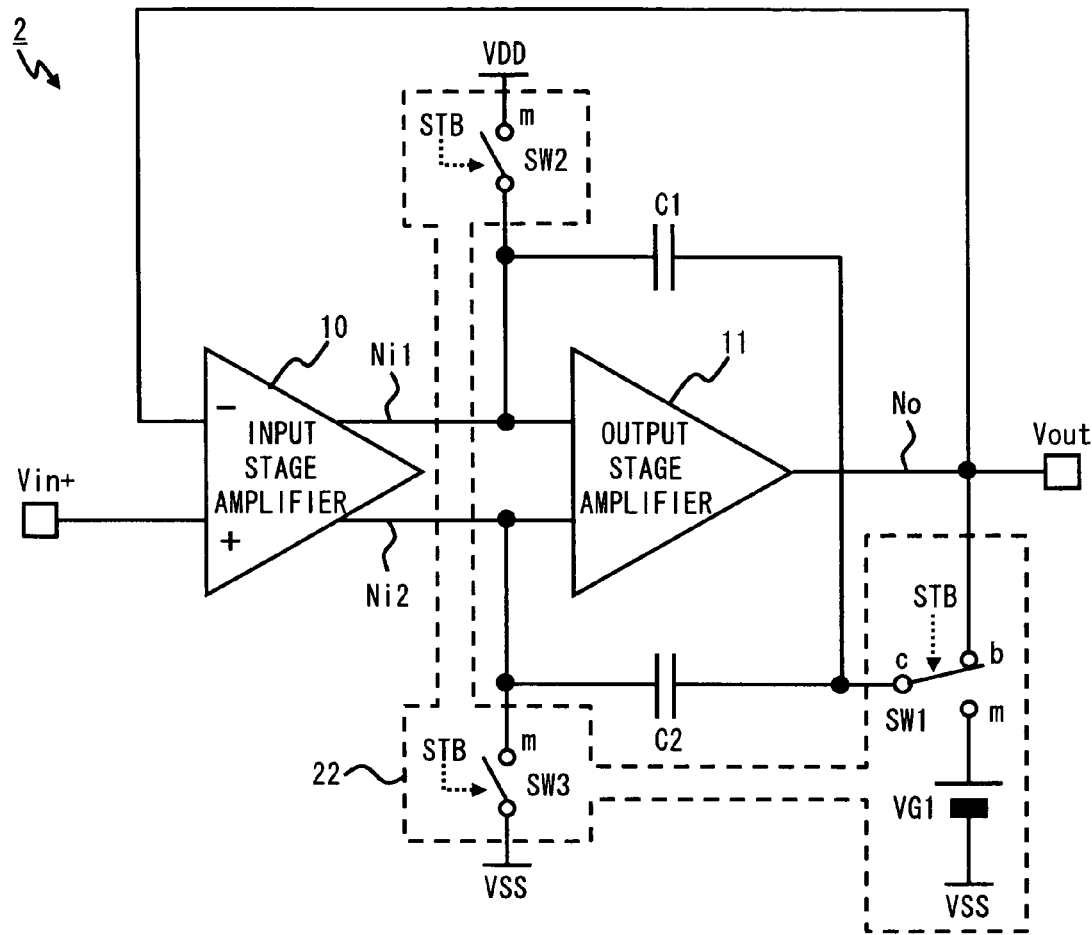
FIG. 8 is a block diagram showing an operational amplifier according to a second exemplary embodiment of the present invention.

FIG. 8 is a block diagram showing an operational amplifier 2 according to a second exemplary embodiment of the present invention. Referring to FIG. 8, the operational amplifier 2 is configured by altering the connection of the switch SW1 in the operational amplifier 1 and adding a voltage source VG1 as the first power supply. In the switch SW1 of the operational amplifier 2, the terminals of the capacitors C1 and C2 on the output node side are connected to the common terminal c, the output node No is connected to the break terminal b, and the positive electrode of the voltage source VG1 is connected to the make terminal m. The negative electrode of the voltage source VG1 is connected to the negative power supply VSS.

Thus, in the operational amplifier 2, it is possible to arbitrarily set the voltages to be applied to the terminals of the capacitors C1 and C2 on the output node side during the charge recovery period according to the setting of the voltage value to be generated by the voltage source VG1. Specifically, in the operational amplifier 2, it is possible to change the amount of charges to be accumulated in the capacitors C1 and C2 at the end of the charge recovery period by changing the voltage value to be generated by the voltage source VG1. Further, even when the current output capacity of the circuit in the previous stage which is connected to the input terminal Vin+ is low, the rapid charging of the capacitors C1 and C2 is possible if the current output capacity of the voltage source VG1 is high. A charge and discharge control circuit 22 according to the second exemplary embodiment is made up of the switch SW1, the switch SW2, the switch SW3 and the first power supply (the voltage source VG1).

[Third Exemplary Embodiment]

Figure 9:
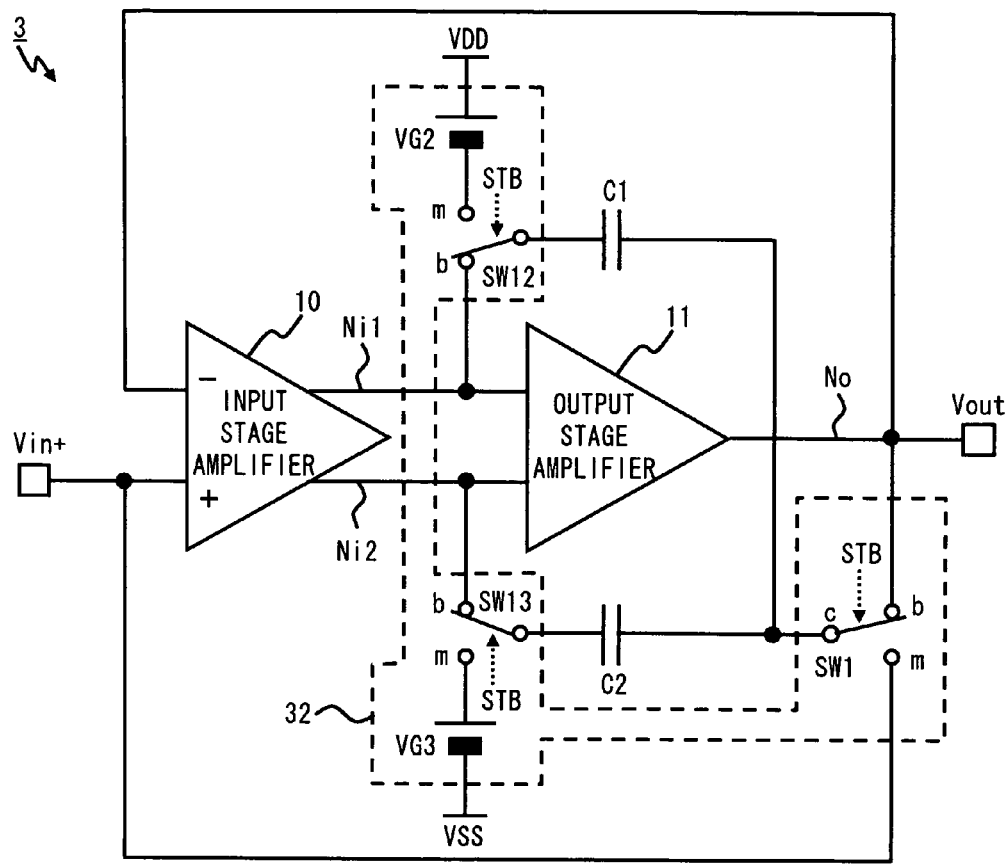
FIG. 9 is a block diagram showing an operational amplifier according to a third exemplary embodiment of the present invention.

FIG. 9 is a block diagram showing an operational amplifier 3 according to a third exemplary embodiment of the present invention. Referring to FIG. 9, the operational amplifier 3 is configured by replacing the second switch (the switch SW2 and the switch SW3) in the operational amplifier 1 with transfer type switches and adding voltage sources VG2 and VG3 as the second power supply. In the switch SW2 of the operational amplifier 3, the terminal of the capacitor C1 on the input node side is connected to the common terminal c, the input node Ni1 is connected to the break terminal b, and the negative electrode of the voltage source VG2 is connected to the make terminal m. The positive electrode of the voltage source VG2 is connected to the positive power supply VDD. In the switch SW3 of the operational amplifier 3, the terminal of the capacitor C2 on the input node side is connected to the common terminal c, the input node Ni2 is connected to the break terminal b, and the positive electrode of the voltage source VG3 is connected to the make terminal m. The negative electrode of the voltage source VG3 is connected to the negative power supply VSS.

Thus, in the operational amplifier 3, it is possible to arbitrarily set the voltages to be applied to the terminals of the capacitors C1 and C2 on the input node side during the charge recovery period according to the setting of the voltage values to be generated by the voltage sources VG2 and VG3. Specifically, in the operational amplifier 3, it is possible to change the amount of charges to be accumulated in the capacitors C1 and C2 at the end of the charge recovery period by changing the voltage values to be generated by the voltage sources VG2 and VG3. Further, the operational amplifier 3 is effective in the case where defects occur when the positive power supply VDD or the negative power supply VSS is applied to the input node of the output stage amplifier 11 during the charge recovery period. For example, by setting the voltage value of the voltage source VG2 and the voltage value of the voltage source VG3 to the threshold voltage of the output transistor, it is possible to suppress fluctuations of the voltage to be applied to the gate of the output transistor before and after the charge recovery period and thereby avoid defects (e.g. generation of abnormal currents) occurring in the operational amplifier. A charge and discharge control circuit 32 according to the third exemplary embodiment is made up of the switch SW1, the switch SW2, the switch SW3 and the second power supply (the voltage source VG2 and the voltage source VG3).

[Fourth Exemplary Embodiment]

Figure 10:
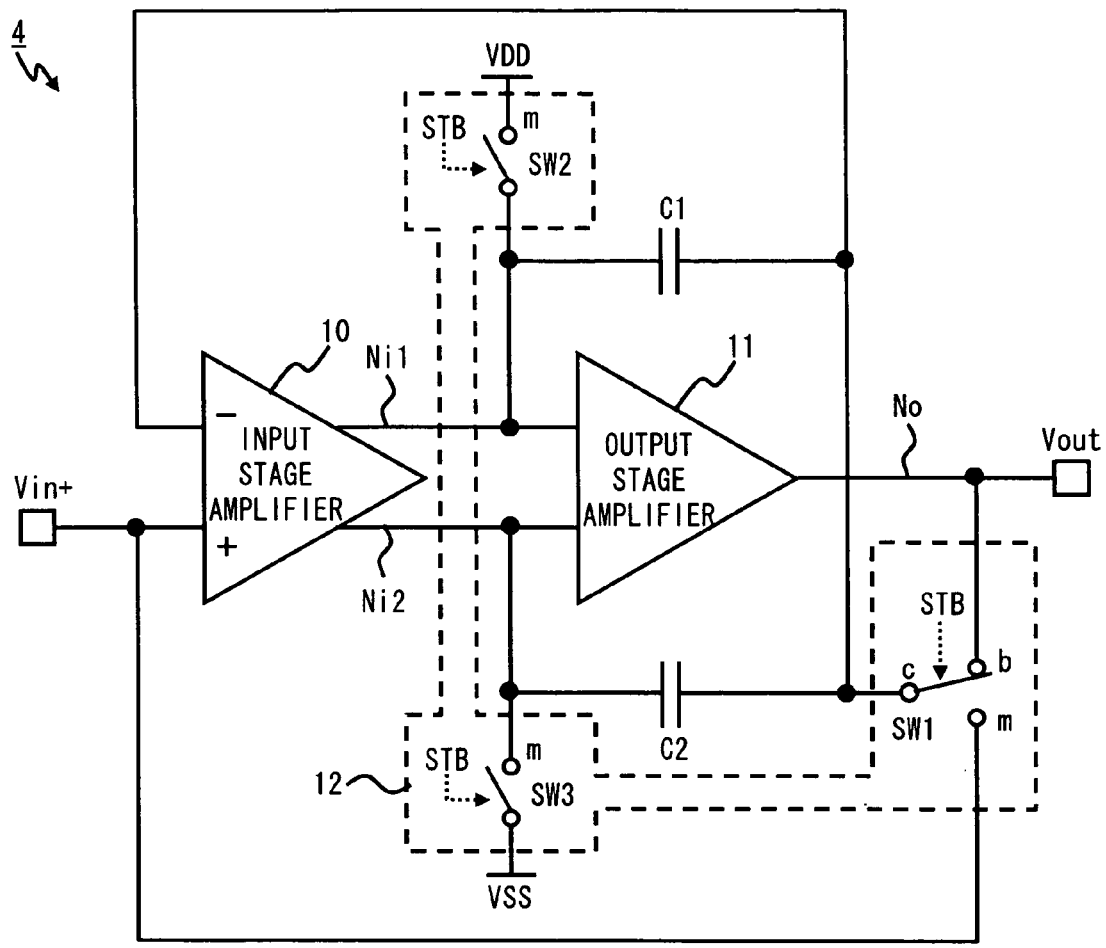
FIG. 10 is a block diagram showing an operational amplifier according to a fourth exemplary embodiment of the present invention.

FIG. 10 is a block diagram showing an operational amplifier 4 according to a fourth exemplary embodiment of the present invention. Referring to FIG. 10, the operational amplifier 4 is configured by altering the connection structure of negative feedback connection of the operational amplifier 1. In the operational amplifier 4, the common terminal c of the switch SW1 and the inverting input terminal of the input stage amplifier 10 are connected. If the negative feedback connection is performed in such a configuration, the connection structure is the same as that of the operational amplifier 1 during the period when the strobe signal STB is low level (normal operation period), and the non-inverting input terminal and the inverting input terminal of the input stage amplifier 10 are short-circuited during the period when the strobe signal STB is high level (charge recovery period). Because the input stage amplifier 10 uses a differential pair as an input structure, the inverting input terminal and the non-inverting input terminal are originally virtually short-circuited. Further, the input stage amplifier 10 and the output stage amplifier 11 do not operate during the charge recovery period. Accordingly, there is no problem even if the non-inverting input terminal and the inverting input terminal of the input stage amplifier 10 are short-circuited during the charge recovery period. Further, the connection structure is the same as that of the operational amplifier 1 during the normal operation period. Thus, the operational amplifier 4 is an example showing another connection structure of the operational amplifier 1, and it is thereby possible to improve the slew rate just like the operational amplifier 1.

[Fifth Exemplary Embodiment]

Figure 11:
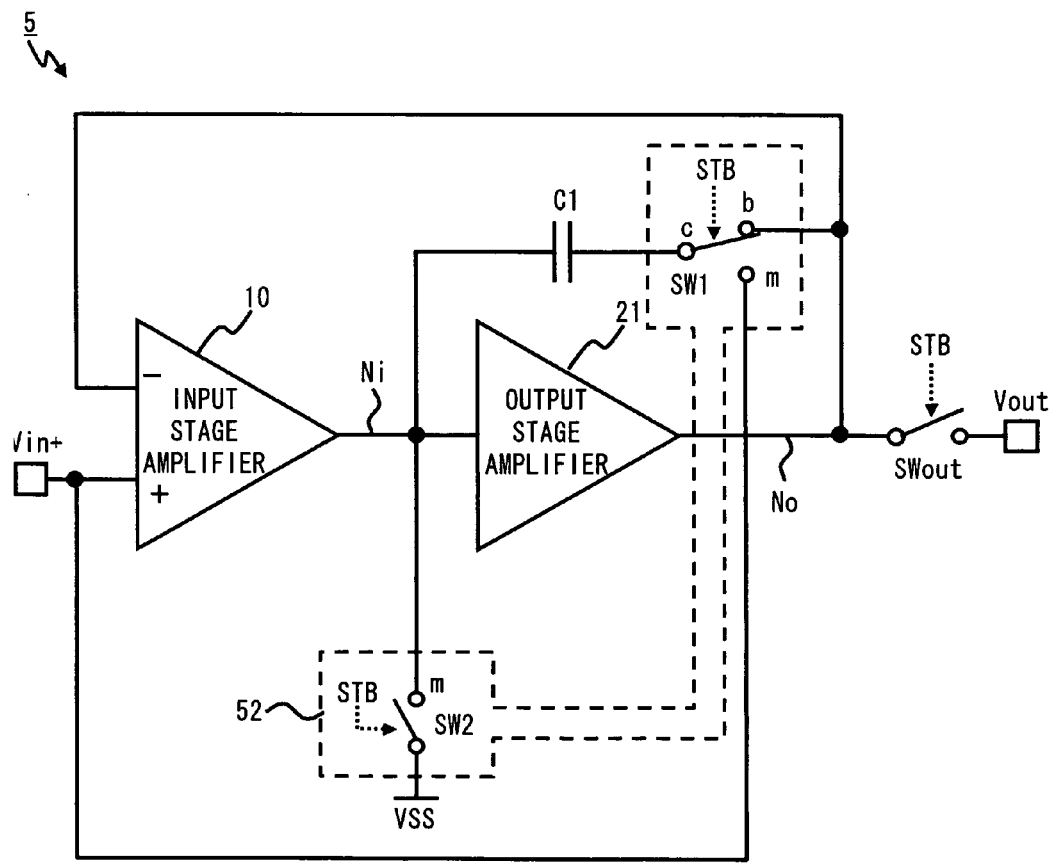
FIG. 11 is a block diagram showing an operational amplifier according to a fifth exemplary embodiment of the present invention.

FIG. 11 is a block diagram showing an operational amplifier 5 according to a fifth exemplary embodiment of the present invention. Referring to FIG. 11, the fifth exemplary embodiment includes an output stage amplifier 21 in a structure having one input node. Further, a charge and discharge control circuit 52 of the operational amplifier 5 includes a capacitor C1, a first switch (e.g. a switch SW1) and a second switch (e.g. a switch SW2) in accordance with the input and output structure of the output stage amplifier 21. The capacitor C1 is connected between the input node Ni of the output stage amplifier 21 and the output node No. The switch SW1 is a transfer type switch, in which the common terminal c is connected to the terminal of the capacitor C1 on the output node side, the break terminal b is connected to the output node No, and the make terminal m is connected to the input terminal Vin+. The switch SW2 is a make type switch and it is connected between the input node Ni and the negative power supply VSS.

In the operational amplifier 5, the common terminal c and the break terminal b of the switch SW1 have continuity and the switch SW2 is opened during the period when the strobe signal STB is low level (normal operation period). The operational amplifier 5 thereby performs normal operation as an amplifier during the normal operation period. On the other hand, the common terminal c and the make terminal m of the switch SW1 have continuity and the switch SW2 is closed during the period when the strobe signal STB is high level (charge recovery period). The operational amplifier 5 thereby performs charge and discharge of the capacitor C1 by the current output from the circuit in the previous stage which is connected to the input terminal Vin+.

Because the output stage amplifier 21 has a structure with one input and one output, the output node No of the output stage amplifier 21 does not become high impedance during the charge recovery period. In such a case, it is preferred to connect a third switch (e.g. an output disconnecting switch SW_out) between the output node No and the output terminal Vout. The output disconnecting switch SW_out is opened during the charge recovery period, so that the output node No is separated from the output terminal Vout, and the output terminal Vout becomes high impedance.

The example of the operational amplifier 5 shows that, even if the output stage amplifier has any input/output structure, it is feasible to alter the switch and the capacitor that form the charge and discharge control circuit as appropriate in accordance with the configuration of the output stage amplifier. Thus, the operational amplifier 5 also achieves improvement of the slew rate just like the operational amplifier 1 according to the first exemplary embodiment.

Figure 12:
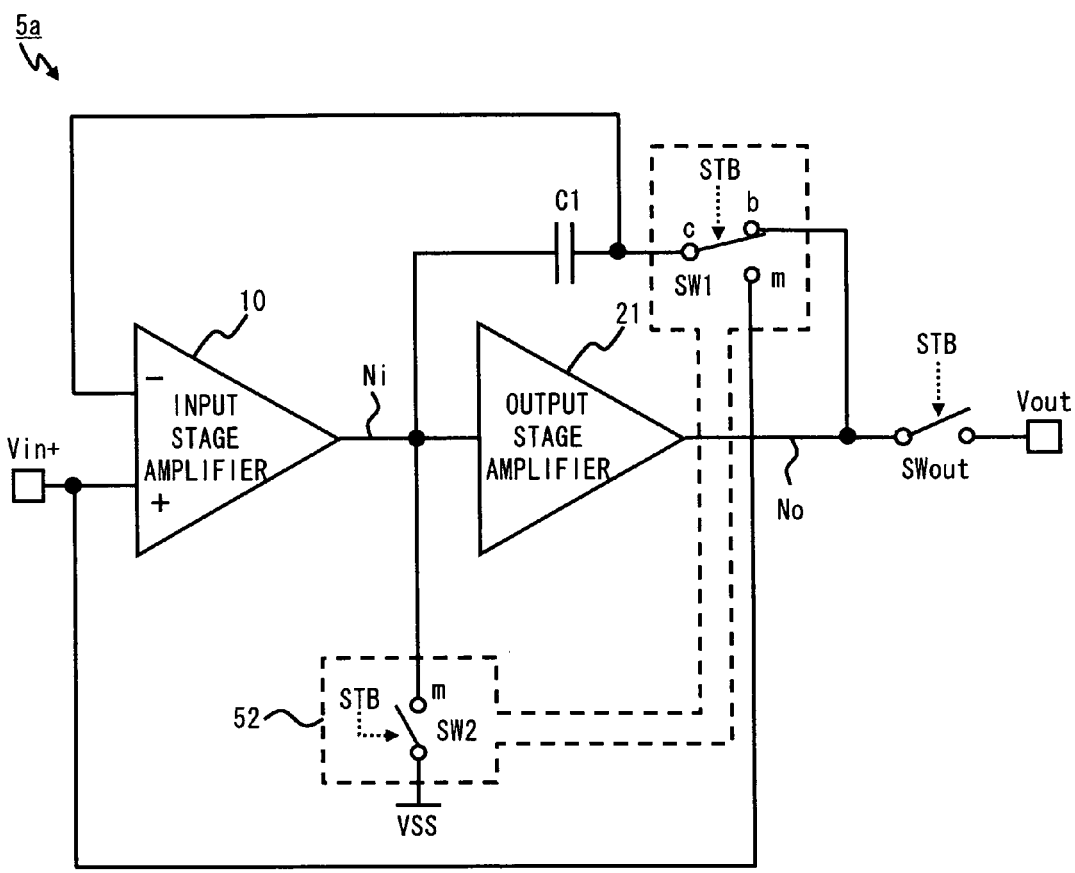
FIG. 12 is a block diagram showing another example of an operational amplifier according to the fifth exemplary embodiment of the present invention.

In the operational amplifier 5 also, the alternation example from the operational amplifier 1 to the operational amplifier 4 may be applied. The operational amplifier in such a case is referred to as an operational amplifier 5a, and FIG. 12 shows a block diagram of the operational amplifier 5a.

[Sixth Exemplary Embodiment]

Figure 13:
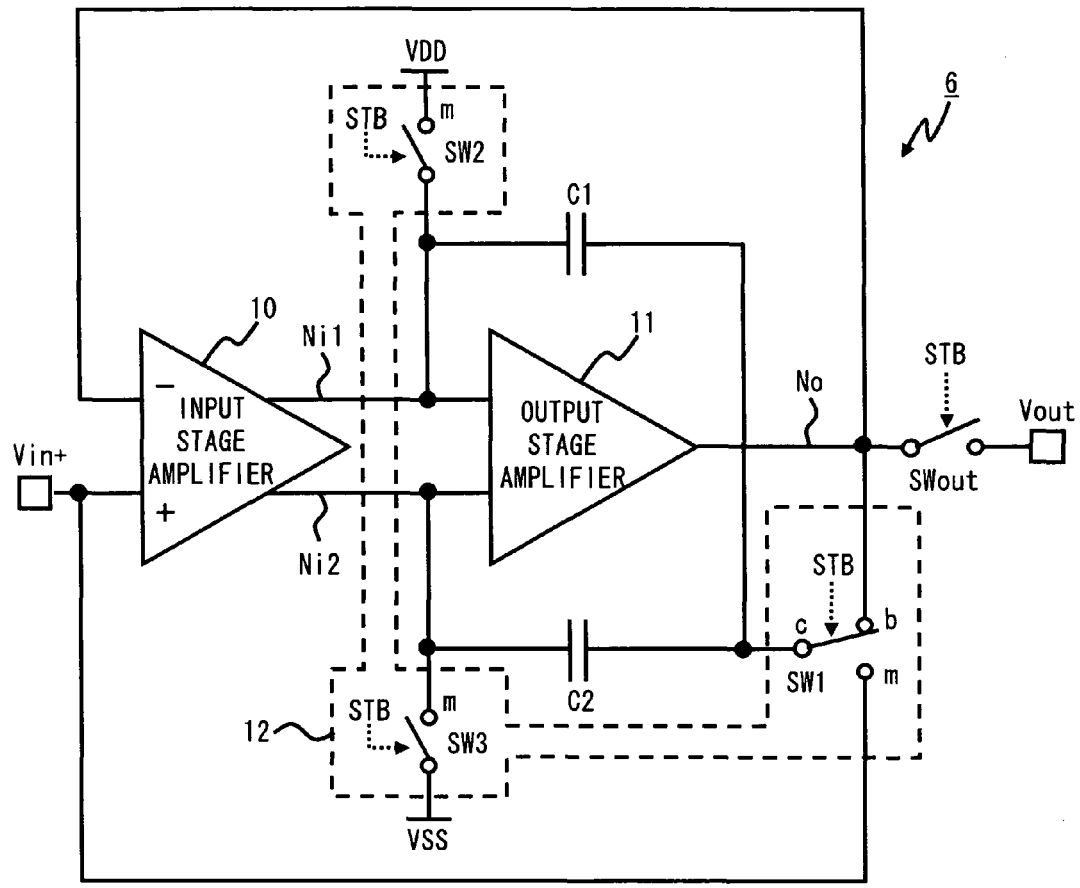
FIG. 13 is a block diagram showing an operational amplifier according to a sixth exemplary embodiment of the present invention.

FIG. 13 is a block diagram showing an operational amplifier 6 according to a sixth exemplary embodiment of the present invention.

Referring to FIG. 13, in the operational amplifier 6, a third switch (e.g. an output disconnecting switch SW_out) is connected between the output node No and the output terminal Vout of the operational amplifier 1. If the output does not become high impedance during the charge recovery period by the circuit structure of the input stage amplifier 10 and the output stage amplifier 11, it is possible to allow the output to become high impedance during the charge recovery period by connecting the output disconnecting switch SW_out between the output node No and the output terminal Vout of the operational amplifier 1.

[Seventh Exemplary Embodiment]

Figure 14:
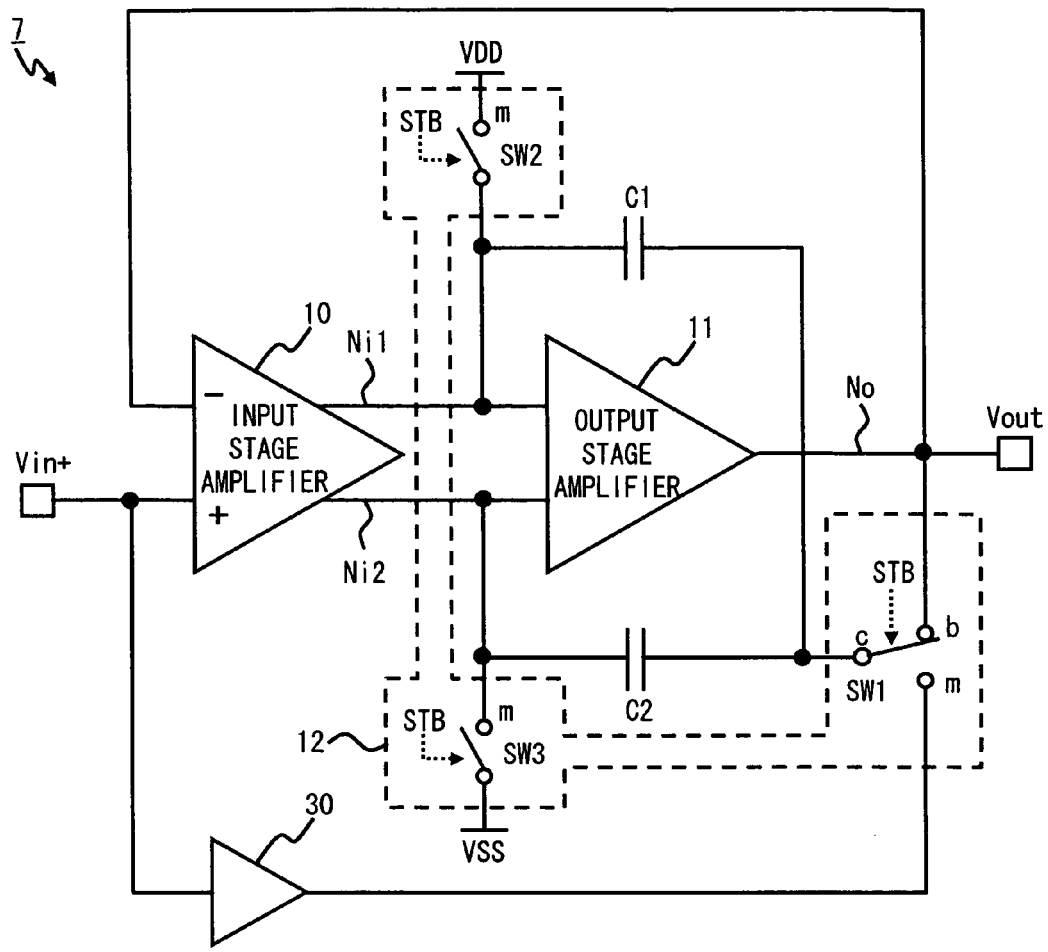
FIG. 14 is a block diagram showing an operational amplifier according to related art.

FIG. 14 shows a block diagram of an operational amplifier 7 according to a seventh exemplary embodiment of the present invention. Referring to FIG. 14, the operational amplifier 7 is configured by adding a buffer circuit 30 between the non-inverting input terminal of the input stage amplifier 10 and the make terminal m of the switch SW1 in the operational amplifier 1.

Figure 15:
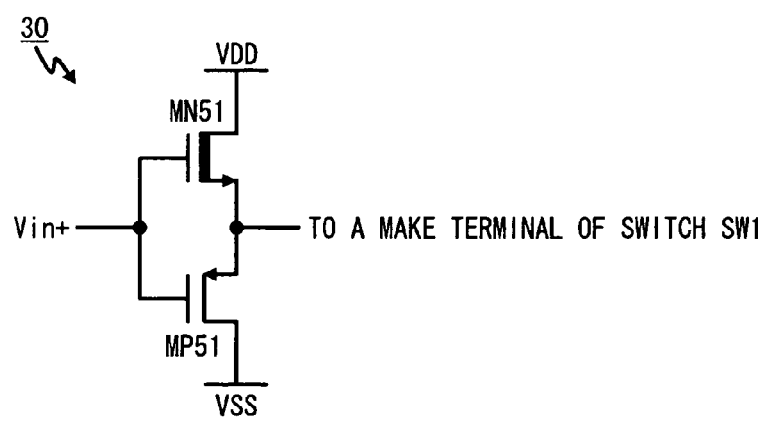
FIG. 15 is a block diagram of an operational amplifier according to a seventh exemplary embodiment.
Figure 16:
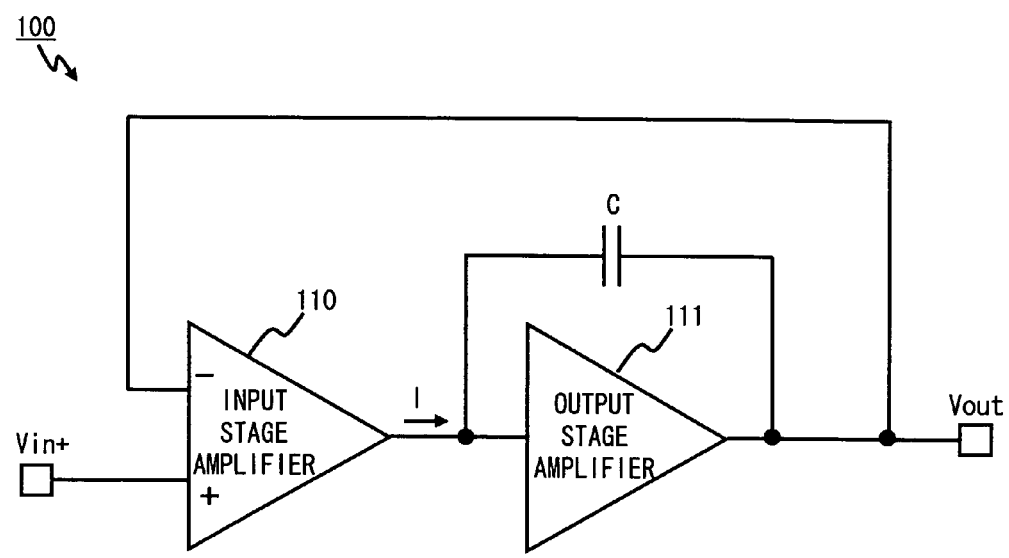
FIG. 16 is a circuit diagram of a buffer according to the seventh exemplary embodiment.

The buffer circuit 30 transmits a signal input from the input terminal Vin+ to the make terminal m of the switch SW1. Further, the input terminal of the buffer circuit 30 is set to high impedance. FIG. 15 shows a detailed circuit diagram of this buffer circuit 30.

Referring to FIG. 15, the buffer circuit 30 includes an NMOS transistor MN51 and a PMOS transistor MP51. The drain of the NMOS transistor MN51 is connected to the positive power supply VDD, and the source is connected to the source of the PMOS transistor MP51. The drain of the PMOS transistor MP51 is connected to the negative power supply VSS. Further, the gates of the NMOS transistor MN51 and the PMOS transistor MP51 are connected together, and also connected to the input terminal Vin+. The buffer circuit 30 functions as a source follower by the NMOS transistor MN51 and the PMOS transistor MP51.

Note that NMOS transistor MN51 is preferably a depletion type transistor. The voltage between the source and gate of a depletion type NMOS transistor in a conductive state is smaller compared to the enhancement type NMOS transistor, and is, for example, a voltage of about 0 V. Therefore, by forming the NMOS transistor MN51 by a depletion type transistor, an output voltage of the buffer circuit 30 having a small offset voltage can be transmitted to the make terminal m of the switch SW1.

In the first exemplary embodiment (FIGS. 1, 2 and 6), third exemplary embodiment (FIG. 9), fourth exemplary embodiment (FIG. 10), fifth exemplary embodiment (FIGS. 11 and 12), and sixth exemplary embodiment (FIG. 13), the input terminal Vin+ is directly connected to the make terminal m of the switch SW1. Therefore, if the output impedance of a circuit in the previous stage, which provides an input signal to the input terminal Vin+, is high, the capacitors C1 and C2 act as a load on the circuit in the previous stage in a state where the switch SW1 is connected to the make terminal m (e.g., charge recovery period), and thus posing a problem that the signal level of the input signal could be shifted.

However, in the operational amplifier 7 according to the seventh exemplary embodiment, the buffer circuit 30 is provided between the make terminal m of the switch SW1, whose input terminal is connected to the capacitors C1 and C2 during the charge recovery period, and the input terminal Vin+. In this manner, by providing the buffer circuit 30, the input impedance viewed from the input terminal Vin+ can be maintained at a high impedance state even in the state where the switch SW1 is connected to the make terminal m. As a result, in the operational amplifier 7, the shift in the input impedance that would otherwise occur due to the switching of the switch SW1 can be eliminated, and the problem that the signal level of the input signal is shifted is also solved. Although, in the seventh exemplary embodiment, the buffer circuit 30 is added to the operational amplifier 1 shown as the first exemplary embodiment, the buffer circuit 30 can be also added to operational amplifiers according to other exemplary embodiments shown in FIGS. 2, 6, and 9 to 13.

Further, the problem that the signal level of the input signal is shifted due to the shift in the input impedance can be also solved by providing a buffer circuit in the input terminal Vin+. In this case, however, it is necessary to cancel the offset voltage of the buffer circuit provided in the input terminal Vin+, thus posing a problem that the circuit scale of the buffer circuit could become larger.

Meanwhile, the buffer circuit 30 is provided between the non-inverting input terminal of the input stage amplifier 10 and the make terminal m of the switch SW1 in the operational amplifier 7. Therefore, the signal level of an input signal that is input to the input stage amplifier 10 through the buffer circuit 30 is not affected by the addition of the buffer circuit 30. Further, the voltage that is supplied to one terminals of the capacitors C1 and C2 through the switch SW1 is supplied to charge/discharge the capacitors C1 and C2. Therefore, even if this voltage is shifted, the influence on the charge/discharge time by this voltage shift is substantially negligible. Therefore, the offset voltage cancelling function of the buffer circuit 30 can be omitted and the circuit scale can be thereby reduced (the number of transistors is two in the example shown in FIG. 15). In the case of a liquid crystal driver or the like in which a number of operational amplifiers 7 are used, it is very important to reduce the number of transistors in each operational amplifier in order to reduce the overall chip size.

Further, the buffer circuit 30 uses a depletion type transistor as the NMOS transistor MN51. In this way, the buffer circuit 30 can be formed with a small number of transistors while the offset voltage can be suppressed to the minimum value. Further, a similar advantageous effect to that obtained by forming the NMOS transistor MN51 by a depletion type transistor can be also obtained by forming the PMOS transistor MP51 by a depletion type transistor. It is also possible to form both the NMOS transistor MN51 and the PMOS transistor MP51 by depletion transistors, provided that the thresholds VT of both the NMOS and PMOS transistors can be accurately controlled. In this way, the offset voltage of the buffer circuit 30 can be reduced even further.

The present invention is not limited to the above-described exemplary embodiments, and various changes and modifications may be made without departing from the scope of the invention. For example, the control signal is not limited to the strobe signal, and an appropriate control signal may be used according to the use of the operational amplifier.

The first to seventh exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. An operational amplifier comprising:
 an input stage amplifier that receives an input signal;
 an output stage amplifier that amplifies a signal output from the input stage amplifier and outputs the signal;
 a capacitor that is connected between an input node and an output node of the output stage amplifier; and
 a charge and discharge control circuit including:
  a first switch comprising:
   a common terminal connected to one end of the capacitor;
   a break terminal connected to the output node of the output stage amplifier; and
   a make terminal connected to the first power supply; and
  a second switch comprising:
   a first terminal connected to an other end of the capacitor; and
   a second terminal connected to a second power supply.

2. The operational amplifier according to claim 1, wherein, in a state transition mode when an output voltage of the output stage amplifier makes transition, the common terminal and the make terminal of the first switch have continuity, and the first terminal and the second terminal of the second switch have continuity.

3. The operational amplifier according to claim 1, wherein the first power supply comprises a circuit that is connected in a previous stage of the input stage amplifier and outputs the input signal.

4. The operational amplifier according to claim 1, wherein the first power supply comprises a first voltage source that outputs a prescribed voltage value.

5. The operational amplifier according to claim 1, wherein the second power supply comprises a power supply that supplies an operating power to at least one of the input stage amplifier and the output stage amplifier.

6. The operational amplifier according to claim 1, wherein the second power supply comprises a second voltage source that generates voltages having a prescribed voltage difference from a voltage of a power supply that supplies an operating power to at least one of the input stage amplifier and the output stage amplifier.

7. The operational amplifier according to claim 1, wherein the input stage amplifier comprises a differential amplifier, and
 wherein an inverting input terminal of the input stage amplifier is connected to the output node of the output stage amplifier.

8. The operational amplifier according to claim 1, wherein the input stage amplifier comprises a differential amplifier comprising an inverting input terminal connected to a terminal of the capacitor on a side of the output node of the output stage amplifier.

9. The operational amplifier according to claim 1, wherein the first switch and the second switch change continuity according to a control signal.

10. The operational amplifier according to claim 9, wherein
 the control signal comprises a strobe signal that is used in a liquid crystal display device.

11. The operational amplifier according to claim 1, further comprising a third switch connected between the output node of the output stage amplifier and an output terminal,
 wherein the third switch changes continuity between the output node and the output terminal.

12. The operational amplifier according to claim 1, wherein the operational amplifier comprises a source driver in a liquid crystal display device.

13. The operational amplifier according to claim 1, further comprising a buffer circuit coupled between a non-inverting input terminal of the input stage amplifier and the charge and discharge control circuit.

14. The operational amplifier according to claim 13, wherein the buffer circuit comprises:
 an NMOS transistor, a drain of the NMOS transistor being connected to a positive power supply; and
 a PMOS transistor, a source of the PMOS transistor being connected to a source of the NMOS transistor, a gate of the PMOS transistor being connected to a gate of the NMOS transistor as a common node, and
 wherein the input signal is provided to the common node.

15. The operational amplifier according to claim 14, wherein at least one of the NMOS transistor and the PMOS transistor comprises a depletion type transistor.

16. A circuit comprising:
 an output amplifier;
 an input amplifier including a non-inverting input node thereof coupled to an input terminal, an inverting input node thereof coupled to an output node of the output amplifier and an output node thereof coupled to an input node of the output amplifier;
 a capacitor coupled between a first node and a second node, the second node being coupled to the input node of the output amplifier;
 a first switch configured to couple the first node to one of a third node and the output node of the output amplifier in response to a control signal; and
 a second switch configured to couple the second node to a predetermined electric potential in response to the control signal.

17. The circuit according to claim 16, wherein the third node is coupled to the non-inverting input node.

18. The circuit according to claim 16, wherein the third node is coupled to the non-inverting input node through a buffer circuit.

19. The circuit according to claim 16, wherein the third node is coupled to a power source.

* * * * *